United States Patent [19]

Sasaki et al.

[11] Patent Number: 4,814,292

[45] Date of Patent: Mar. 21, 1989

[54] PROCESS OF FABRICATING A SEMICONDUCTOR DEVICE INVOLVING DENSIFICATION AND RECRYSTALLIZATION OF AMORPHOUS SILICON

[75] Inventors: Masayoshi Sasaki; Teruo Katoh, both of Tokyo, Japan

[73] Assignee: Oki Electric Industry Co., Ltd., Tokyo, Japan

[21] Appl. No.: 67,412

[22] Filed: Jun. 19, 1987

[30] Foreign Application Priority Data

Jul. 2, 1986 [JP] Japan ................................. 61-154135

[51] Int. Cl.⁴ .............................................. H01L 21/32
[52] U.S. Cl. ...................................... 437/101; 437/40;
437/83; 437/84; 437/233; 437/247; 437/248;
148/DIG. 1
[58] Field of Search ................. 357/59 E; 437/101, 83,
437/937, 248, 247, 233, 225, 228, 81, 82, 108,
109, 46; 148/DIG. 3, DIG. 150

[56] References Cited

U.S. PATENT DOCUMENTS

| | | | |
|---|---|---|---|
| 3,337,375 | 8/1967 | Casey et al. | 148/DIG. 3 |
| 3,875,657 | 4/1975 | Clarke et al. | 148/DIG. 150 |
| 3,900,345 | 8/1975 | Lesk | 148/DIG. 3 |
| 4,196,438 | 4/1980 | Carlson | 437/101 |
| 4,358,326 | 11/1982 | Doe | 437/101 |
| 4,385,937 | 5/1983 | Ohmura | 357/99 E |
| 4,437,922 | 3/1984 | Bischaff et al. | 437/248 |
| 4,565,584 | 1/1986 | Tamura | 437/101 |
| 4,605,447 | 8/1986 | Brotherton et al. | 437/937 |
| 4,700,461 | 10/1987 | Choi et al. | 437/83 |
| 4,772,565 | 9/1988 | Kamimura et al. | 437/101 |

FOREIGN PATENT DOCUMENTS

| | | | |
|---|---|---|---|
| 0211634 | 2/1987 | European Pat. Off. | 437/101 |
| 0096723 | 6/1984 | Japan | 437/101 |

OTHER PUBLICATIONS

Kamins, T. et al, "Hydrogenation of Transistors . . .", IEEE Elect. Dev. Lett., vol. EDL-1, No. 8, Aug. '80, pp. 159–161.
IEEE Electron Device Letters, vol. EDL-5, No. 11, Nov. 1984, pp. 468–470, "Hydrogen Passivation of Polysilicon MOSFET's from a Plasma Nitride Source", Pollack et al.

Primary Examiner—Brian E. Hearn
Assistant Examiner—Kevin McAndrews
Attorney, Agent, or Firm—Spencer & Frank

[57] ABSTRACT

In a process of fabricating a semiconductor device, an amorphous semiconductor layer is formed on a substrate, densified by heat-treatment, and is subjected to further heat-treatment to be changed into a polycrystalline semiconductor layer. A MOS transistor can be formed using the polycrystalline semiconductor layer.

8 Claims, 4 Drawing Sheets

Si DEPOSITION

DENSIFYING

CRYSTALIZATION

FORMING A TRANSISTOR

PROCESS OF FABRICATING A SEMICONDUCTOR DEVICE INVOLVING DENSIFICATION AND RECRYSTALLIZATION OF AMORPHOUS SILICON

BACKGROUND OF THE INVENTION

The present invention relates to a process of fabricating a semiconductor device, particularly a semiconductor IC having a MOS transistor formed on a polysilicon layer, which in turn is on an insulating layer.

In prior art semiconductor IC devices, active elements such as transistors are formed in a single crystal silicon substrate and these elements are connected by wiring. However, to enable a further increase in the degree of integration, there is an increasing demand for realizing a multi-stack LSI or a three-dimensional LSI in which transistors are also formed on an insulating layer. Various methods have been studied to meet the demand. In one method, polysilicon is deposited on an insulating layer, and the deposited polysilicon is changed into single crystal silicon by LASER irradiation. In another method, the polysilicon itself is used for the formation of the transistor.

However, the LASER irradiation technique is not yet fully developed or controllable and transistors formed on polysilicon have poor characteristics. This is because the polysilicon layer formed by CVD consists of minute grains (normally about 10 to 100 nm) and there are plenty of electrically active sites where interatomic bond are disconnected, which are called dangling bonds, or misfits of crystals present in the grain boundaries, causing degradation of the transistor characteristics. Measures to alleviate the problem are now being studied. In one measure, the polysilicon is heat-treated in hydrogen atmosphere to inactivate, electrically, the dangling bonds.

The above-described measure has not yet been successful in fully improving the characteristics of the transistors.

SUMMARY OF THE INVENTION

An object of the invention is to remove the causes of the poor characteristics of prior art polysilicon transistors.

Another object of the invention is to improve the characteristics of a polysilicon transistor.

A further object of the invention is to enable fabrication of a polysilicon layer having grains larger than possible with prior art methods.

According to the invention, there is provided a process of fabricating a semiconductor device comprising the steps of:

(a) forming an amorphous semiconductor layer on a substrate, (b) performing a heat-treatment of the amorphous semiconductor layer to densify the amorphous semiconductor layer, (c) performing a heat-treatment of the densified amorphous semiconductor layer to change the densified amorphous semiconductor layer into a polycrystalline semiconductor layer, and (d) forming a MOS transistor using the polycrystalline semiconductor layer.

With the process recited above, a semiconductor device having a low threshold voltage and good device characteristics can be obtained.

DETAILED DESCRIPTION OF THE PREFERRED EMBODIMENTS

Embodiments of the invention will now be described with reference to the drawings.

Figure 1:
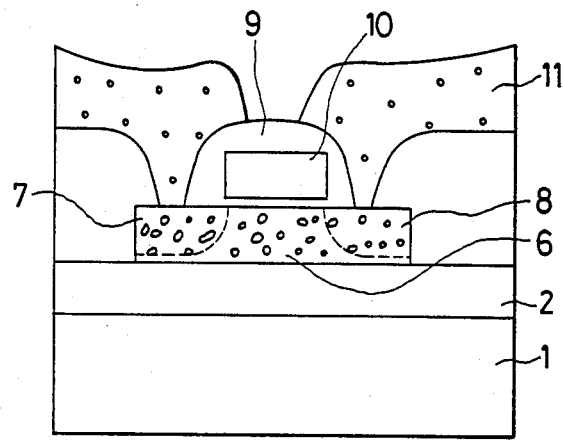
FIG. 1 is a cross sectional view showing a semiconductor device according to the invention.

FIG. 1 is a cross sectional view showing a semiconductor device with a polysilicon transistor according to the invention. The illustrated semiconductor device comprises a silicon substrate 1, an insulating layer 2 formed of silicon dioxide ($SiO_2$), a polysilicon layer 6 doped to be of the $p^-$-type, a polysilicon source 7 doped to be of the $n^+$-type, a polysilicon drain 8 doped to be of the $n^+$-type, an insulating layer 9, a gate polysilicon 10, and an aluminum (Al) wiring conductor 11.

According to the invention, the semiconductor device illustrated in FIG. 1 can be fabricated in a manner shown in FIGS. 2a to 2d.

First, an insulating layer or film 2 of $SiO_2$ or the like is formed on a surface of Si substrate 1. The insulating layer 2 is made to cover a part all of the surface of the Si substrate 1.

Figure 2A:
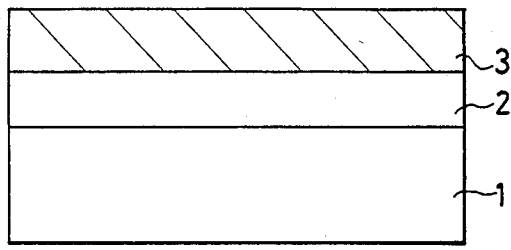
FIGS. 2a to 2d are cross sectional views showing various steps during fabrication of the semiconductor device shown in FIG. 1.

The substrate is then placed in a vapor deposition apparatus and evacuated to a vacuum of $10^{-5}$ Pa or less. The temperature of the substrate is kept at or lower than 200° C., and Si is deposited on the insulating layer 2 to a thickness of about 500 nm, as shown in FIG. 2a. The resultant Si layer is an amorphous Si layer 3. Higher deposition rates are preferred. For instance, when the vacuum degree is at $10^{-6}$ Pa, the deposition rate should preferrably be 50 nm/minute or higher. This is to reduce the amount of impurities taken into the amorphous Si layer. The optimum deposition rate depends on the vacuum degree, the types of remaining gases etc. If impurities such as oxygen (O), and carbon (C) are mixed in the amorphous Si, an excessive number of crystallization nuclei develop during crystallization in a subsequent step to be described later, and the resultant grains have smaller sizes than desired.

Figure 3:
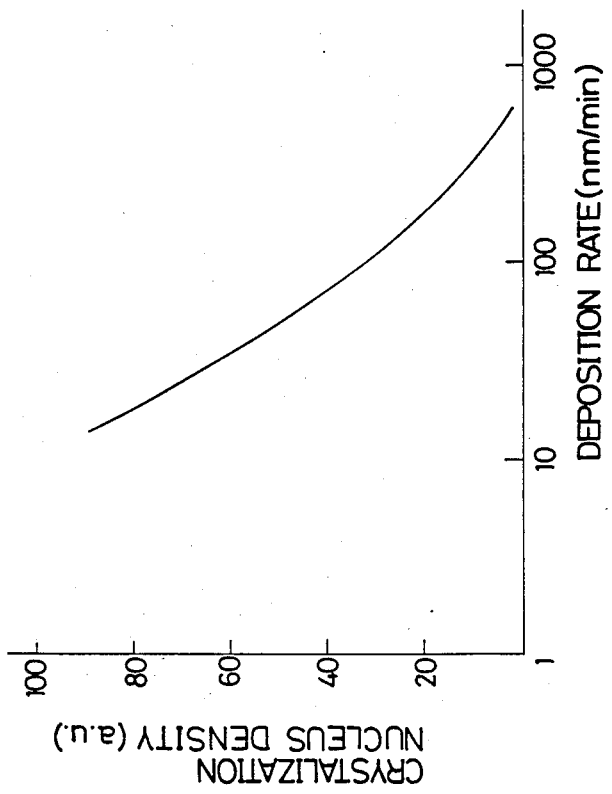
FIG. 3 is a diagram showing crystallization nuclei density versus deposition rate.

FIG. 3 shows the relationship between the deposition rate and the crystallization nuclei density or spatial frequency. In FIG. 3 (as well as in FIG. 4 later described), "a.u." stands for arbitrary unit representing a relative value. It is seen from FIG. 3 that a greater deposition rate results in lower density of crystallization nuclei. The optimum crystallization nuclei density cannot be unequivocally determined, but to obtain grains of about 500 nm, the deposition rate should be 50 nm/min or higher.

Figure 2B:
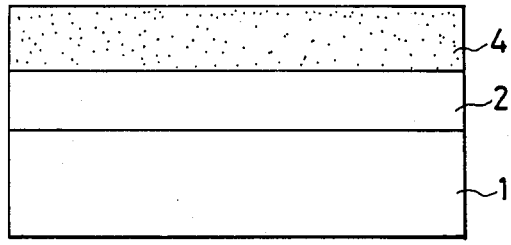

After the deposition of the amorphous Si layer 3, the substrate is heated at a temperature of 300° to 450° C.

for 10 minutes to 1 hour. The heating should be carried out in the same chamber as the deposition and the vacuum used in the deposition should be maintained. With this heat treatment, the amorphous Si layer is densified, to result in a structure as shown in FIG. 2b. When the substrate is taken out of the chamber into the air, densified amorphous Si layer 4 prevents the oxygen in the air from entering the amorphous Si layer 4.

Figure 4:
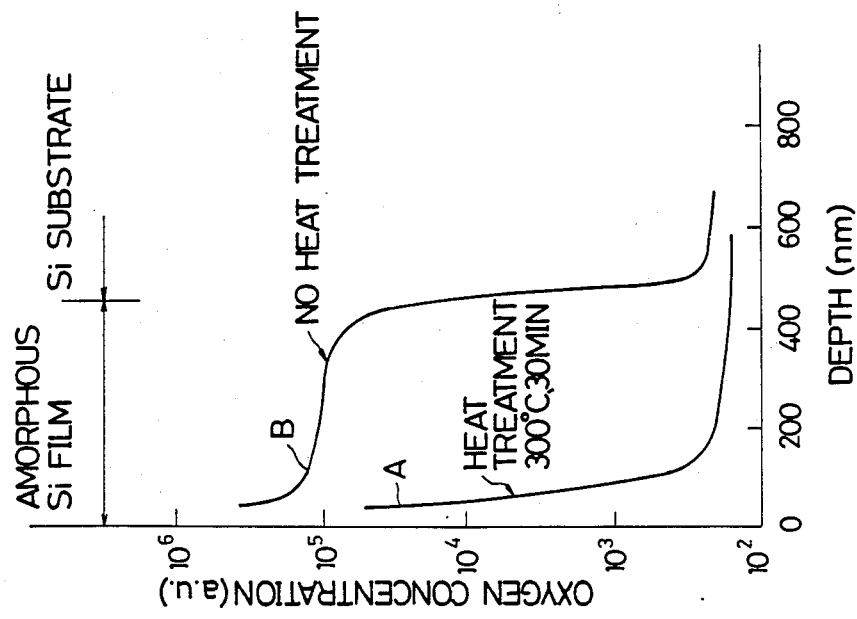
FIG. 4 is a diagram showing oxygen concentration profiles.

FIG. 4 shows profiles of oxygen content of the densified and undensified amorphous Si layers. The figure evidences that densification by heat treatment significantly reduces the penetration of oxygen.

Figure 2C:
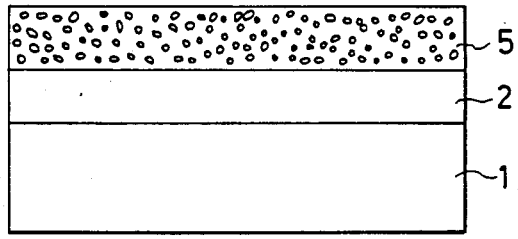

After the densification heat treatment, the substrate is heated in a nitrogen atmosphere at a temperature of 600° C. for 15 minutes, to crystallize the amorphous Si thereby producing a polysilicon layer 5 as shown in FIG. 2c. The crystallization can take place at a temparature of 500° C. or higher. But at a temperature of about 500° C., the rate of crystallization is low and is not practical. At a temperature of 700° C. or higher, the rate of crystallization is too high and the resultant grains are not large enough. Within the temperature range of 550° C. to 650° C., the crystallization proceeds relatively slowly and grows large grains. The heating time can be determined by taking account of various conditions, but it has been found that 20 to 25 hours is suitable when the temperature is 550° C. and 3 to 10 hours is suitable when the temperature is 650° C. The polysilicon layer 5 formed as described above has grains of 500 nm or larger. Such a grain size is more than 10 times greater than in the polysilicon layer formed by CVD.

Figure 2D:
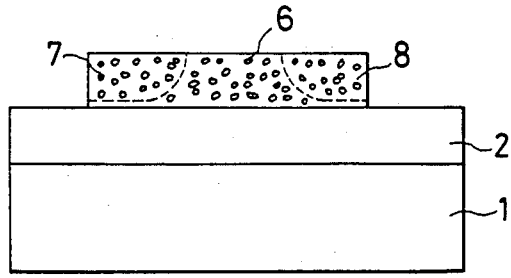

The polysilicon layer 5 is then doped with impurities such as phosphorus (P) and boron (B)and unnecessary parts of the polysilicon layer 5 are etched away by photolithography leaving the desired pattern as shown in FIG. 2d. Then process steps, such as metallization, which one generally employed and which themselves are well known, are employed to form a MOS transistor, as shown in FIG. 1.

Figure 5:
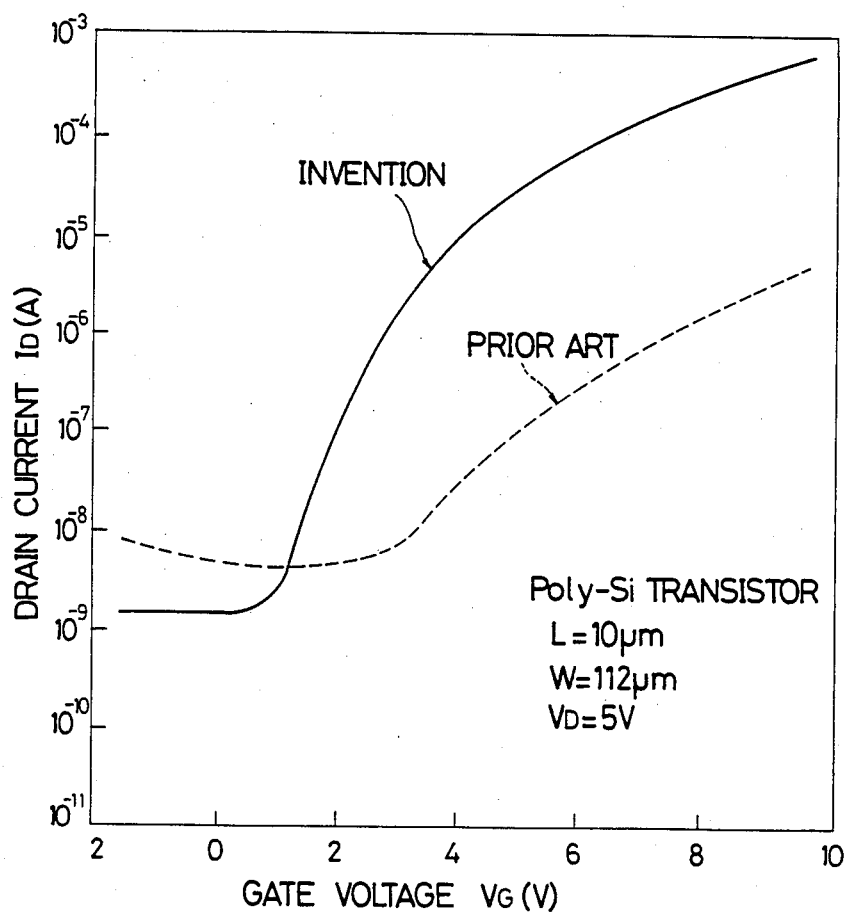
FIG. 5 is a diagram showing a subthreshold characteristic of a polysilicon transistor according to the invention.

FIG. 5 shows, by a solid line, the subthreshold characteristic of a MOS transistor formed in the above-described process. For comparison, a broken line shows the charateristic of a polysilicon transistor formed on a polysilicon layer formed by a conventional CVD method. The length L of the transistor is 10 micrometers, the width W is 112 micrometers, and the drain voltage $V_D$ is 5V.

A comparison of the transistor according to the invention with the MOS transistor according to the prior art indicates the following improvements:
 (a) The ON current is more than 100 times greater.
 (b) The carrier mobility is increased.
 (c) The threshold voltage is decreased.
 (d) The current-voltage gradient in the subthreshold is improved.
 (e) The leak current is reduced.

These are all important factors and are advantageous in most applications. Thus, the polysilicon transistor according to the invention has superior device characteristics.

In the embodiment described, amorphous Si is deposited by vacuum vapor deposition. But deposition can be any other method which impedes inclusion of impurities such as oxygen and carbon, in the amorphous silicon. For instance, similar results can be expected if a CVD apparatus, well controlled to avoid mixture of undesirable gases, is used for thermal decomposition of $SiH_4$ at about 550° C. to deposit amorphous silicon.

In the embodiment described, densified amorphous Si4 is changed to polysilicon layer 5 before being doped with phosphorus or boron. But doping can be carried out before polycrystallization. Alternatively, doping can be carried out after polysilicon layer 5 is patterned by photolithography. A further modification is to mix impurities, such as phosphorus, boron, arsenic (As), antimony (Sb), gallium (Ga), at the step of amorphous Si deposition. Boron can be mixed with the Si vapor deposition material, while other impurities can be evaporated from a separate crucible simultaneously with the Si evaporation. With this method of mixing impurities at the time of deposition, number of process steps can be reduced.

Figure 6:
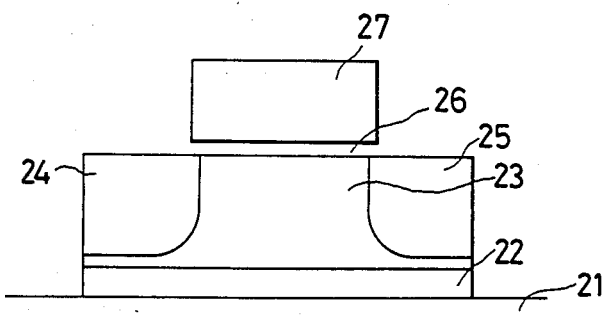
FIG. 6 is a cross sectional view of a polysilicon transistor of another embodiment of the invention.

FIG. 6 shows another embodiment of the invention. This embodiment is characterized by an arrangement for preventing formation of a back channel. The back channel, which is a current path at the interface between the polysilicon layer and the underlying $SiO_2$ layer, under the channel region causes a leak current (as does a poor crystalline property of the polysilicon layer). To prevent the formation of the back channel, impurities such as phosphorus or boron can be incorporated in high concentration in the region near the interface, i. e., at the begining of the amorphous Si deposition. For instance, when the MOS transistor to be of the n-channel type, a region 22 of the polysilicon layer near an $SiO_2$ layer 21 on the substrate (not shown in FIG. 6) is doped with boron at a concentration of $10^{16}$ to $10^{18}$ atoms/cc, and a part 23 of the polysilicon layer, immediately under gate oxide film 26 is doped with boron at a concentration of $10^{13}$ to $10^{16}$ atoms/cc. FIG. 6 also shows a polysilicon source 24 doped to be of the $n^+$ type, a polysilicon drain 25 doped to be of the $n^+$ type, and a polysilicon gate electrode 27.

The concentration of the impurity need not have stepwise profiles as in the case of FIG. 6, but may be graded, i. e., gradually changed.

Various other modifications can be made to the invention without departing from the scope and spirit of the invention.

In the embodiments of FIG. 1 and FIG. 6, the polysilicon transistor is formed on an $SiO_2$ layer which is on a silicon substrate, but the invention is applicable to a polysilicon transistor which is formed on an insulating substrate such as glass.

The polysilicon transistors according to the invention can be used as load transistors for a flip-flop circuit in a memory cell of a static random access memory. Since the transistor can be formed on an insulating film, the degree of integration can be increased. Moreover, the threshold voltage can be made lower than prior art polysilicon transistors, so that the transistor is suitable for application in a low-power consumption transistor array for driving a liquid crystal display.

As has been described according to the invention, amorphous silicon is deposited, densified and crystallized, by the unique method as described above, to produce polysilicon having large grains. As a result, polysilicon transistors having good characteristics can be obtained.

What is claimed is:
1. A process of fabricating a semiconductor device comprising the steps of:
 (a) forming an amorphous silicon layer on a substrate by vacuum vapor deposition in a vacuum of not higher than about $10^{-5}$ Pa, at a substrate tempera- ture of not more than about 200° C., and at a deposition rate of not lower than about 50 nm/minute;
(b) heat-treating the amorphous silicon layer in the same vacuum maintained from step (a) at a substrate temperature of about 300° to 450° C. for about 10 minutes to 1 hour to provide a densified amorphous silicon layer;
(c) heat-treating the densified amorphous silicon layer at a temperature of about 550° to 650° C. for about 3 to 25 hours to change the densified amorphous silicon layer into a polycrystalline silicon layer; and
(d) forming an MOS transistor by a process including photoetching the polycrystalline silicon layer to produce a desired pattern in the polycrystalline silicon layer, and doping the polycrystalline silicon layer with an impurity.

2. The process according to claim 1, wherein the amorphous silicon layer formed in step (a) is simultaneously doped in step (a) with an impurity consisting of phosphorus, arsenic, boron, antimony, or gallium.

3. The process according to claim 2, wherein the impurity consists of boron, and the deposition is performed first to deposit a first layer of amorphous silicon having an impurity concentration of about $10^{16}$ to $10^{18}$ atoms/cc, and subsequently to deposit another layer of amorphous silicon having an impurity concentration of about $10^{13}$ to $10^{16}$ atoms/cc.

4. The process according to claim 1, wherein the substrate is a silicon substrate at least partially covered with an insulating layer, or is a substrate which itself is an insulator.

5. A process of fabricating a polycrystalline silicon layer comprising the steps of:
(a) forming an amorphous silicon layer on a substrate by vacuum vapor deposition in a vacuum of not higher than about $10^{-5}$ Pa, at a substrate temperature of not more than about 200° C., and at a deposition rate of not lower than about 50 nm/minute;
(b) heat-treating the amorphous silicon layer in the same vacuum maintained from step (a) at a substrate temperature of about 300° to 450° C. for about 10 minutes to 1 hour to provide a densified amorphous silicon layer; and
(c) heat-treating the densified amorphous silicon layer at a temperature of about 550° to 650° C. for about 3 to 25 hours to change the densified amorphous silicon layer into a polycrystalline silicon layer.

6. The process according to claim 5, wherein the amorphous silicon layer formed in step (a) is simultaneously doped in step (a) with an impurity consisting of phosphorus, arsenic, boron, antimony, or gallium.

7. The process according to claim 6, wherein the impurity consists of boron, and the deposition is performed first to deposit a first layer of amorphous silicon having an impurity concentration of about $10^{16}$ to $10^{18}$ atoms/cc, and subsequently to deposit another layer of amorphous silicon having an impurity concentration of about $10^{13}$ to $10^{16}$ atoms/cc.

8. The process according to claim 5, wherein the substrate is a silicon substrate at least partially covered with an insulating layer, or is a substrate which itself is an insulator.

* * * * *